US012623545B2

(12) United States Patent
Wang et al.

(10) Patent No.: US 12,623,545 B2
(45) Date of Patent: May 12, 2026

(54) ANOMALY DETECTION IN HIGH-VOLTAGE BUS SYSTEMS

(71) Applicant: Cummins Inc., Columbus, IN (US)

(72) Inventors: Weiwen Wang, Carmel, IN (US);
Martin T. Books, Columbus, IN (US)

(73) Assignee: Cummins Inc., Columbus, IN (US)

( * ) Notice: Subject to any disclaimer, the term of this patent is extended or adjusted under 35 U.S.C. 154(b) by 509 days.

(21) Appl. No.: 18/117,293

(22) Filed: Mar. 3, 2023

(65) Prior Publication Data

US 2023/0302908 A1 Sep. 28, 2023

Related U.S. Application Data

(60) Provisional application No. 63/322,578, filed on Mar. 22, 2022.

(51) Int. Cl.
B60L 3/00 (2019.01)
B60R 16/023 (2006.01)
(Continued)

(52) U.S. Cl.
CPC ........ B60L 3/0023 (2013.01); B60R 16/0238 (2013.01); G01R 19/16528 (2013.01); G01R 31/007 (2013.01); G07C 5/0816 (2013.01)

(58) Field of Classification Search
None
See application file for complete search history.

(56) References Cited

U.S. PATENT DOCUMENTS 4,780,620 A * 10/1988 Hogberg ............... H04J 3/0647
340/4.2
7,750,501 B2 7/2010 Huang
(Continued)

FOREIGN PATENT DOCUMENTS

| CN | 106696709 B | * | 4/2019 | ............... B60L 3/00 |
| CN | 113095395 A | * | 7/2021 | ............. G06F 18/24 |

(Continued)

OTHER PUBLICATIONS

"Voltage Classes for Electric Mobility"ZVEI, Published by: ZVEI—German Electrical and Electronic Manufacturers Association Centre of Excellence, Dec. 2013 Available Online (Year: 2013).*

(Continued)

*Primary Examiner* — Catherine T. Rastovski
*Assistant Examiner* — Toni D Sauncy
(74) *Attorney, Agent, or Firm* — Faegre Drinker Biddle & Reath LLP

(57) ABSTRACT

Methods and systems are provided for troubleshooting anomalies in a high-voltage bus system for an electrified vehicle are provided herein. The high-voltage bus system being electrically connected to a plurality of electrical components such that each electrical component in the plurality of electrical components has a similar voltage when the high-voltage bus system is electrified. The method includes detecting individual voltages for each electrical component in the plurality of electrical components using a voltage sensor of each of the electrical components in the plurality of electrical components; determining a baseline voltage for each of the electrical components in the plurality of electrical components, the baseline voltage corresponding to at least a subset of the individual voltages; and comparing any one of the individual voltages to the baseline voltage to determine if that individual voltage is anomalous.

19 Claims, 7 Drawing Sheets

(51) Int. Cl.

| | | |
|---|---|---|
| *G01R 19/165* | (2006.01) | |
| *G01R 31/00* | (2006.01) | |
| *G07C 5/08* | (2006.01) | |

(56) References Cited

U.S. PATENT DOCUMENTS

| | | | |
|---|---|---|---|
| 9,475,437 | B2 | 10/2016 | Fassnacht |
| 9,915,693 | B2 | 3/2018 | Park et al. |
| 2009/0228163 | A1 | 9/2009 | Tarchinski |
| 2011/0153236 | A1* | 6/2011 | Montreuil ............ G01R 31/088 |
| | | | 702/58 |
| 2015/0226778 | A1 | 8/2015 | Weber |
| 2019/0111786 | A1* | 4/2019 | Qian ..................... B60L 3/0069 |
| 2020/0119544 | A1* | 4/2020 | Fisher .................... H01H 50/12 |
| 2020/0274375 | A1* | 8/2020 | Griffiths ................... H02J 7/24 |
| 2020/0353834 | A1* | 11/2020 | Elshaer ................ H02H 1/0007 |
| 2021/0011088 | A1* | 1/2021 | Morimoto ............ B60L 3/0069 |
| 2022/0105793 | A1* | 4/2022 | Sukhatankar ......... B60W 30/19 |
| 2024/0042863 | A1* | 2/2024 | Allgaeuer .......... G01R 31/2843 |

FOREIGN PATENT DOCUMENTS

| | | | | |
|---|---|---|---|---|
| EP | 2626964 | A1 | 8/2013 | |
| EP | 2626964 | B1 * | 3/2021 | ............... B60L 3/04 |
| EP | 3798648 | A1 * | 3/2021 | ............ G01R 31/52 |
| JP | 6996895 | B2 * | 1/2022 | |

OTHER PUBLICATIONS

LI_CN106696709B_ENGLISHTRANSLATION_UsedForExamination (Year: 2019).*

EP-2626964-B1_ENGLISHTRANSLATION_PE2E (Year: 2021).*

Zou, et. al. "A Novel Busbar Protection Based on the Average", Energies 2018, 11, 1139; doi: 10.3390/en11051139 (Year: 2018).*

WANG_CN 113095395 A_ ENGLISH_TRANSLATION_UsedForExamination (Year: 2021).*

DIGARD_EP3798648_ENGLISH Translation Used for Examination (Year: 2021).*

\* cited by examiner

Top Level Architecture - REEV

Top Level Architecture - BEV

ANOMALY DETECTION IN HIGH-VOLTAGE BUS SYSTEMS

CROSS-REFERENCE

The present application claims priority to U.S. Provisional Application Ser. No. 63/322,578, entitled "ANOMALY DETECTION IN HIGH-VOLTAGE BUS SYSTEMS," filed on Mar. 22, 2022, the entire disclosure of which being expressly incorporated herein by reference.

TECHNICAL FIELD

The present disclosure generally relates to devices, systems, and methods for electrified vehicles and, more particularly, to detect voltage anomalies in an electrified vehicle.

BACKGROUND

Electrified vehicles are becoming increasingly pervasive in the automotive industry as environmental concerns and industry demands, among other things, beckon for increased efficiency and less emissions. Inherent in such vehicles are electrical connections to ensure that associated components receive sufficient power for operation of the vehicle. As with all vehicles, maintenance and troubleshooting are required to maintain proper operation over the lifespan of the vehicle.

SUMMARY

In an example, the present disclosure provides a method of troubleshooting anomalies in a high-voltage bus system for an electrified vehicle, the high-voltage bus system being electrically connected to a plurality of electrical components such that each electrical component in the plurality of electrical components has a similar voltage when the high-voltage bus system is electrified, the method comprising: detecting individual voltages for each electrical component in the plurality of electrical components using a voltage sensor of each of the electrical components in the plurality of electrical components; determining a baseline voltage for each of the electrical components in the plurality of electrical components, the baseline voltage corresponding to at least a subset of the individual voltages; and comparing any one of the individual voltages to the baseline voltage to determine if that individual voltage is anomalous. In one aspect of this example the baseline voltage is a mean value of the subset of the individual voltages. In a variant of this aspect, the mean value is equal to a total sum of the individual voltages for each of the electrical components in the plurality of electrical components divided by a total number of the electrical components on the high-voltage bus system. In another variant of this aspect, when one of the individual voltages is anomalous, the subset of the individual voltages excludes that individual voltage that is anomalous. In a further aspect of the variant, the subset of the individual voltages includes all the individual voltages for each of the electrical components in the plurality of electrical components except for the individual voltage that is anomalous. In another feature of this example, the baseline voltage is determined over an evaluation period.

In another example including the baseline voltage mentioned above, the individual voltage is determined to be anomalous if at least one of the following conditions is true: the individual voltage is consistently higher than the baseline voltage over the evaluation period, and the individual voltage is consistently lower than the baseline voltage over the evaluation period. This example can optionally include comparing any one of the individual voltages to the baseline voltage to determine if that individual voltage is anomalous step is used to perform a voltage sensor rationality check on the electrical component that has the individual voltage that is anomalous. Further, the method can include checking connected cabling and corresponding connections between the high-voltage bus system and the electrical component that has the individual voltage that is anomalous, and replacing the connected cabling when it is determined that the connected cabling caused the individual voltage to be anomalous. In a variant of this aspect, the method further includes replacing the electrical component if it is determined that the connected cabling did not cause the individual voltage to be anomalous. In another aspect of this example, the method further includes providing an alert to an operator of the electrified vehicle when it is determined that the individual voltage is anomalous. A variant of this aspect includes that the alert indicates a degree to which the individual voltage is anomalous.

In another example, the present disclosure provides a controller for managing anomalies in a high-voltage bus system for an electrified vehicle, the high-voltage bus system being electrically connected to a plurality of electrical components such that each electrical component in the plurality of electrical components has a similar voltage when the high-voltage bus system is electrified, the controller being configured to: detect individual voltages for each electrical component in the plurality of electrical components using a voltage sensor of each of the electrical components in the plurality of electrical components; determine a baseline voltage for each of the electrical components in the plurality of electrical components, the baseline voltage corresponding to at least a subset of the individual voltages; and compare any one of the individual voltages to the baseline voltage to determine if that individual voltage is anomalous. In another aspect of this example, the controller is further configured to identify each of the electrical components in the plurality of electrical components and to convey information related to the identity of electrical components to an operator when it is determined that the individual voltage of the electrical component is anomalous. In some variants, the controller is formed as a system control module for the electrified vehicle. In other variants, the controller is further configured to control voltage conversions using the baseline voltage.

In yet another example, the present disclosure provides for a powertrain for an electrified vehicle, the powertrain comprising: a high-voltage bus system; a plurality of electrical components that are connected to the high-voltage bus system such that each electrical component in the plurality of electrical components has a similar voltage when the high-voltage bus system is electrified; and a controller for managing anomalies in the high-voltage bus system, the controller being configured to: detect individual voltages for each of the electrical components in the plurality of electrical components using a voltage sensor of each of the electrical components in the plurality of electrical components; determine a baseline voltage for each of the electrical components in the plurality of electrical components, the baseline voltage corresponding to at least a subset of the individual voltages; and compare any one of the individual voltages to the baseline voltage to determine if that individual voltage is anomalous. In one aspect of this example, the powertrain is configured to be integrated into a battery-operated vehicle. In another aspect of this example, powertrain is configured to be integrated into a hybrid vehicle. In yet another aspect of this example, the controller is further configured to identify each of the electrical components in the plurality of electrical components and to convey information related to the identity of the electrical components to the operator when it is determined that the individual voltage of the electrical component is anomalous, wherein the baseline voltage is a mean value that is equal to a total sum of the individual voltages for each of the electrical components in the plurality of electrical components divided by a total number of the components on the bus, and wherein the individual voltage is determined to be anomalous if at least one of the following conditions is true: the individual voltage is consistently higher than the baseline voltage over the evaluation period, and the individual voltage is consistently lower than the baseline voltage.

DETAILED DESCRIPTION OF THE DRAWINGS

Figure 1:
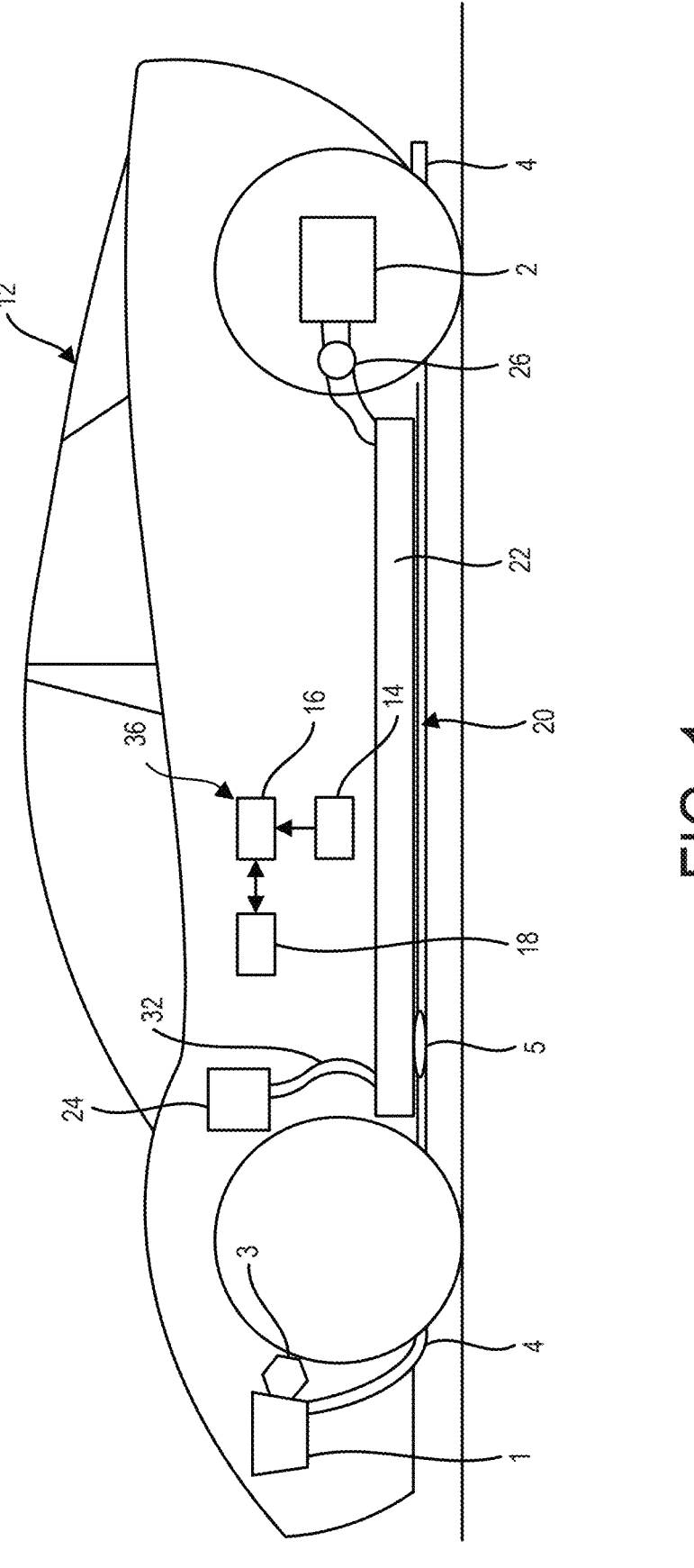
FIG. 1 is a schematic diagram of an emissions management system according to one example of the present disclosure.

For the purposes of promoting an understanding of the principles of the present disclosure, reference is now made to the examples illustrated in the drawings, which are described below. The exemplary examples disclosed herein are not intended to be exhaustive or to limit the disclosure to the precise form disclosed in the following detailed description. Rather, these exemplary examples were chosen and described so that others skilled in the art can utilize their teachings. It is not beyond the scope of this disclosure to have a number (e.g., all) the features in a given example to be used across all examples.

In the interest of clarity, not all routine features of the examples described herein are shown and described. It will, of course, be appreciated that in the development of any such actual implementation, numerous implementation-specific decisions must be made to according to specific goals, such as compliance with application-related and business-related constraints, and that these specific goals will vary over time and across such implementations. Moreover, it will be appreciated that such a development effort might be complex and time-consuming, but would nevertheless be a routine undertaking for those of ordinary skill in the art having the benefit of this disclosure.

The present disclosure is directed to an electrified vehicle. More particularly, the present disclosure is directed to both fully electric vehicles and hybrid vehicles. Electrified vehicles use electricity from a battery in place of or in addition to traditional fuel sources, such as diesel, gasoline, or fuel cells. To functionally use an electrified vehicle, electrical components of the electrified vehicle must be functioning and using voltage provided by the battery. Diagnosing a failure or anomaly in the electric vehicle system components is often difficult and inaccurate using known techniques in the prior art. For example, in one two-month field data set for three high-voltage bus systems, a DC/DC converter experienced 15 voltage anomalies. Operators of systems that use a high-voltage bus system would save time if there was a way to quickly and accurately determine when and where a system experiences a voltage anomaly.

Advantageously, the present disclosure provides efficient and accurate systems and methods of identifying voltage anomalies, such as those anomalies that occur in the electrical components. Another advantage of the present disclosure is that it provides a method and system that instructs operators to take certain remedial actions in response to detected voltage anomalies. Such principles of the present disclosure are useful in a variety of electrified vehicle platforms, including Battery Electric Vehicles ("BEV") and Range Extended Electric Vehicles ("REEV") platforms as further discussed below.

As backdrop, FIG. 1 shows a schematic diagram of an electrified vehicle 12. The schematic diagram generally shows an electric vehicle with a powertrain, which is known to power the electrified vehicle 12 using certain energy or power sources (e.g., batteries, engines, generators, etc.) that are used to generate power and, ultimately, movement at the drivetrain. More specifically, the powertrain illustrated here is a series hybrid vehicle with an internal combustion engine 1 (e.g., an internal combustion engine 1) and one or more electric motors 2, 3. The electrified vehicle 12 generally includes a fuel system (e.g., a fuel tank and associated fuel lines, each not shown) for the engine 1 and an aftertreatment system 4. In the electrified vehicle 12, harmful emissions from the engine 1 are passed through the aftertreatment system 4 (e.g., via an exhaust) and converted by catalyst (e.g., in a catalytic converter 5) into less harmful emissions before exiting the aftertreatment system 4 (e.g., via a tailpipe).

Regarding the electric portion of the powertrain, an electric motor 2 is provided at and is operatively connected to the rear wheels for independent operation of the wheels. In addition, the engine 1 includes a connected electric motor 3, such as an electric traction motor, to provide electrical power for use by the vehicle. For instance, the electric motor 3 can include an electric generator, which generates electricity from braking rotating wheels and transfers that energy back to a battery 22 (or collection of batteries/battery packs). The battery 22 can be a traction battery, which stores electricity for use by the electric traction motor 250. Some electric generators can perform both the drive and regeneration functions. The battery 22 can include one or more cells that employ any of various suitable energy storage technologies such as lithium-ion batteries. The battery 22 provides the stored electricity to the traction inverter 26, which converts DC current into 3-phase AC current that one or more electric motors 2, 3 use to power the rear wheels.

The electrified vehicle 12 includes principles of the present disclosure relating to troubleshooting anomalies in a high-voltage bus system 20 and an engine 1, an electric motor 2, a battery 22, and an onboard AC charger. As shown, the electrified vehicle 12 includes a high-voltage system 20, such as a high-voltage bus system 20, that connects a plurality of electrical components that are included in the powertrain of the electrified vehicle 12. The system generally includes a sensor assembly 14, a controller 16 and a transceiver 18. The sensor assembly 14 can include at least one sensor. As shown, a high-voltage bus system 20 includes a battery 22, a DC-DC converter 24, and a traction inverter 26. The components of the high voltage bus system 20 are connected via high voltage cabling 32. As such, the components receive voltage from the battery 22 via high-voltage cabling 32.

Notably, at least the controller 16 of the electrified vehicle 12 in FIG. 1 contributes to employing principles of the present disclosure. In certain examples, the controller 16 is in communication with a processor 36 that receives inputs (e.g., from the sensor assembly 14 or from user demand) that are communicated to transceiver 18. The processor 36 can generate or store data by accessing a memory device that is included with the controller 16 and/or a server. In this regard, the controller 16 controls the electrical components connected to the high-voltage bus 20 within the powertrain. The controller 16 is also in communication with at least one voltage sensor of any (e.g., all) of the electrical components through a private comm system 33. The controller 16 receives signals through the private comm 33 from each of the voltage sensors of the plurality of electrical components. These signals can indicate the voltage level at each component.

The controller 16 is configured to perform a troubleshooting procedure that is further discussed elsewhere herein. In general, though, the controller 16 detects individual voltages for each electrical component connected thereto. Using this information, the controller 16 determines a baseline voltage for each of the electrical components (e.g., calculated using a mean, average, or other like operation). Then, the controller 16 compares each individual voltage to the baseline voltage to determine if any individual voltage is anomalous (e.g., outside of an allowable voltage range or value). In examples, the controller 16 is configured to convey information related to the identity of electrical components to an operator when the individual voltage of the electrical component is anomalous. The controller 16 can be configured to convey the identity of an electrical component in the plurality of electrical components that is experiencing a voltage anomaly to the operator using the method described herein.

Although certain drivetrains are depicted as part of the powertrain of the electrified vehicle 12, this disclosure should not be limited to just those shown. Indeed, drivetrains across examples of electrified vehicles can be varied. In one example, the hybrid vehicle can be configured in a series hybrid configuration. In other examples, however, the vehicle can be configured as another type of hybrid-powered vehicle (e.g., a parallel hybrid electric vehicle such as a strong or mild parallel hybrid electric vehicle, a series-parallel hybrid electric vehicle, etc.). In a series hybrid, the engine 1 can drive an electric generator 202, which both charges a battery 22 and powers an electric motor 2 that moves the vehicle, instead of directly driving the wheels. In operation, the electric motor 2 can be operatively connected to the engine 1 and the battery 22.

Figure 2:
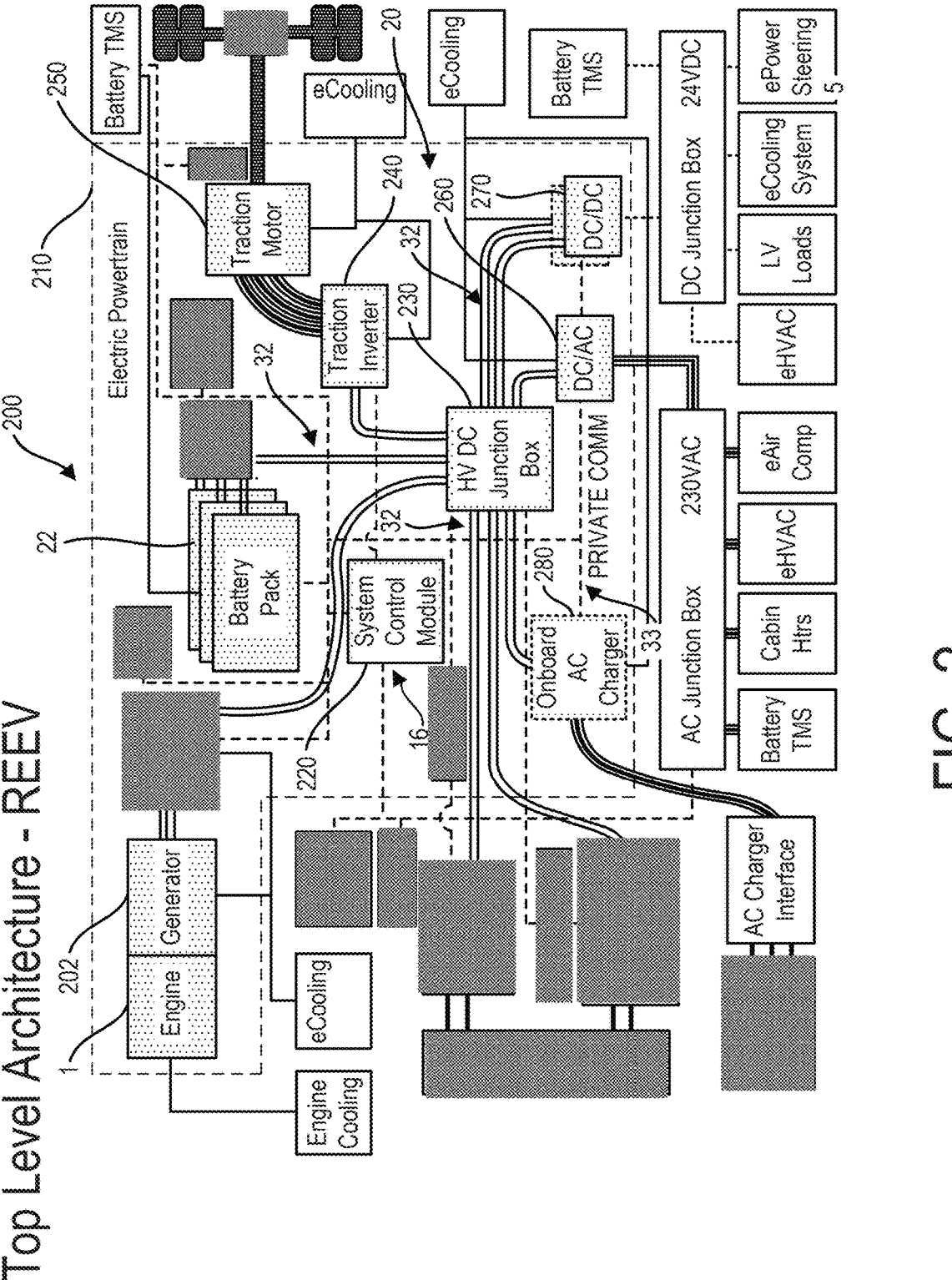
FIG. 2 is an electric diagram of a Range Extended Electric Vehicle system according to one example of the present disclosure.
Figure 3:
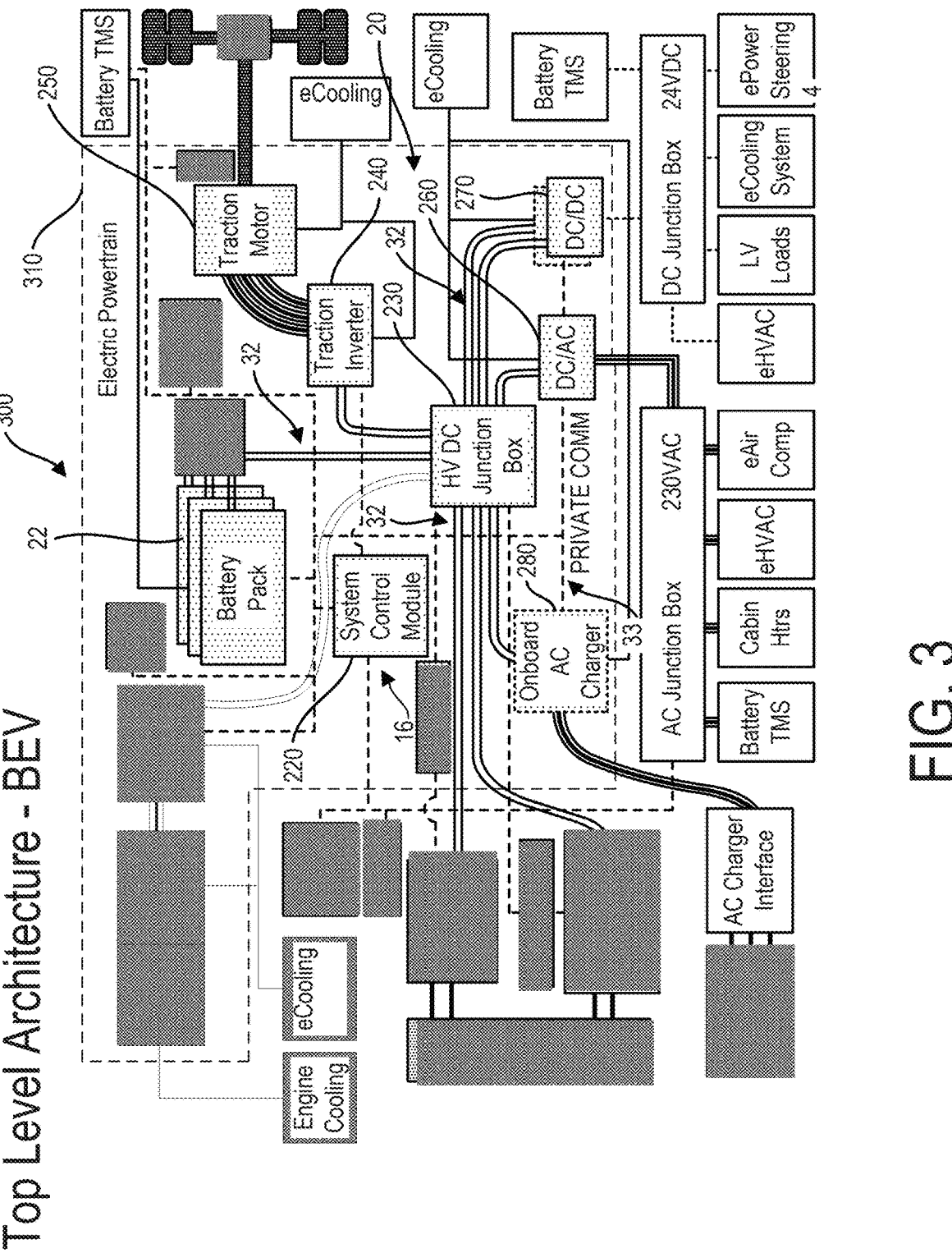
FIG. 3 is an electric diagram of a Battery Electric Vehicle system according to one example of the present disclosure.

More discussion of principles of the present disclosure will now be discussed in relation to FIGS. 2-3. In particular, FIG. 2 shows an electric diagram of a REEV system 200 with an REEV powertrain 210 that employs principles of the present disclosure. FIG. 3 shows an electric diagram of a BEV system 300 with a BEV powertrain 310 that employs principles of the present disclosure is shown. For illustration purposes, each of these diagrams includes dashed connecting lines that indicate electrical communication links between electrical components. Also depicted are high-voltage cabling 32 (e.g., seen emanating mostly from the HV DC junction box 230).

A primary distinction between the systems 200, 300 in FIGS. 2 and 3 are their power sources. More specifically, the REEV in FIG. 2 includes an engine 1 and several related components while the BEV does not. As shown, the REEV electric diagram depicts a system for a hybrid electric vehicle, which includes an engine 1 and a battery 22. The REEV draws its power from both engine 1, which uses traditional fuel sources, and battery 22. The BEV electrical diagram depicts a system for a fully electric vehicle, which includes only a battery 22 to supply power.

FIG. 2's REEV electric diagram includes a powertrain 210, which can include an engine 1, a generator 202, an onboard AC charger 280 and/or a DC charger 280, a traction system, and a high voltage system. Onboard AC charger 280 allows for the battery 22 to be charged by drawing electricity from an outside source. In some examples, onboard AC charger 280 allows for the electrified vehicle to be charged by plugging the vehicle into an outlet.

FIG. 3's BEV electric diagram includes a powertrain 310, which, can include an onboard AC charger 280 or DC charger 280, a traction system, and a high voltage system. The traction system and high voltage system of FIG. 3 are the same as the traction system and high voltage system of FIG. 2.

Several components are common in each of the electric diagrams of FIG. 2 and FIG. 3. As can be seen when comparing FIGS. 2 and 3, common features among powertrain 210 and powertrain 310 can include, among other things, a battery 22, a system control module 220, an HV DC junction box 230, a traction inverter 240, a traction motor 250, a DC/AC converter 260, a DC/DC converter 270, and an onboard AC charger 280. More details about these common components are discussed below.

Both REEV system 200 and BEV system 300 rely on a plurality of electrical components to function. Over time, normal wear and tear or other events cause deterioration, the electrical components in systems 200 and 300 can become faulty and experience voltage anomalies. To functionally use an REEV system 200 or a BEV system 300, electrical components thereof use voltage provided by the battery. Diagnosing a failure or anomaly in the electric vehicle system components is useful for the operator to be able to use the vehicle effectively. Advantageously, the present disclosure provides efficient and accurate systems and methods of identifying voltage anomalies, such as those anomalies that occur in the electrical components. Another advantage of the present disclosure is that it provides a method and system that instructs operators to take certain remedial actions in response to detected voltage anomalies. The system and methods disclosed herein are useful for a multitude of electrical systems that involve current flowing through cabling connecting different electrical components.

The illustrated example of the system in FIGS. 2-3 includes the controller 16, which can be similar to those controllers discussed elsewhere herein (e.g., in relation to FIG. 1). Here, controller 16 can be a standalone device or part of a system control module 220. Controller 16 can include a data processing system having memory, storage, processing and communication hardware, firmware and/or software. The data processing system can include a processor or a computer configured to access the memory. In this regard, exemplary procedures in accordance with the present disclosure described herein can be performed by a processing arrangement (e.g., one or more processors), a computing arrangement (e.g., one or more computers), or both. Such arrangements can be, e.g., entirely or a part of, or include, but not limited to, a computer, a processor, or both, each of which can include, e.g., one or more processors (e.g., CPUs or microprocessors), and use a non-transitory computer-readable medium (e.g., RAM, ROM, hard drive, or other storage device) with instructions stored thereon. Instructions, among other things, can be stored on a storage (e.g., HDD, SSD, etc.) that is in communication with the data processing system. In examples, the data processing system can be a server running a private cloud platform or a multi-tenant platform. Controller 16 can be a single device or a distributed device, and the functions of controller 16 can be performed by hardware and/or as computer instructions on a non-transient computer readable storage medium.

Master control of the REEV and BEV systems 200, 300 is handled by the controller 16 to influence drivability of the system. For instance, the controller 16 can be in the form of a system control module 220 (SCM), Hybrid Control Module (HCM), or the like. In this regard, the controller 16 is in communication with the electrical components in the system. Under these circumstances, the controller 16 receives signals (e.g., driver input signals such as pedal inputs or other control signals such as vehicle speed and on/off status) and uses these signals to manage the system. For instance, the controller 16 can manage system energy (e.g., as supplied by the battery 22) and torque as well as coordinate operation of the motor, battery 22 and the powertrain 210. As discussed above, the REEV and BEV systems 200, 300 shown in FIGS. 2 and 3 is a high-voltage, bus-based network (e.g., similar to the high-voltage bus system 20 in FIG. 1) with a battery 22 and HV DC junction box 230 that distributes high-voltage within the system through high-voltage cabling 32. When the system is not electrified (e.g., when certain contacts such as those from the battery are open in the high-voltage system), the controller 16 may not operate as there is no current flow through the system, although it is contemplated that there are examples in with the controller 16 is operation even when the system is not electrified.

The controller 16 can optionally be configured to control the traction system. Such traction systems can be similar to those known in the art. For instance, the traction invertor can convert the DC power received from the HV DC junction box 230 provided by the battery 22 into AC power to drive the traction motor 250. The traction motor 250 uses the AC power to rotate the wheels of the vehicle. The turning force produced by the traction motor 250 is run through a differential to switch the angle of rotation so that the axel that rotates the wheels can accept the power from the traction motor 250. The rotating power from the traction motor 250 is turned 90 degrees after passing through the differential.

Voltage conversions performed by certain electrical components can be influenced by the controller 16. The controller 16 can be configured to control a plurality of converters. REEV and BEV systems 200, 300 have a DC/AC converter 260 and a DC/DC converter 270. The DC/AC converter 260 receives direct current and converts the direct current into alternating current to send to other components of the electrified vehicle. Such components can include an AC junction box which can connect or disconnect voltage to battery TMS, cabin htrs, eHVAC, and eAir Comp. Similarly, the DC/DC converter 270 receives direct current and converts it into a lower voltage direct current to be supplied to other parts of the electrified vehicle. Such components include a DC junction box, which can connect or disconnect voltage to eHVAC, LV loads, ecooling, and epower steering systems.

As prior noted, it is useful to detect and troubleshoot issues in electrical connections in any vehicle, especially electrified vehicles. In this regard, the controller 16 can carry out a method of determining anomalies in voltages within the powertrain 210 system. Each individual electrical component of the powertrain 210 system is connected on a high-voltage bus through a series of high-voltage cables. Using the series of cables, the controller 16 can detect each electrical component that is in communication with the high-voltage bus. The controller 16 can detect which electrical components are presently connected to the high voltage bus or not.

A baseline voltage for each electrical component can form the basis of analysis performed by the controller 16. For instance, the controller 16 can further be configured to determine a baseline voltage for each electrical component. The configuration of the plurality of electrical components connections on the high-voltage bus causes the voltage drop across cables to each of the plurality of electrical components to be similar. Thus, the baseline voltage for each electrical component, as read by the controller 16, should be the same. The controller 16 can leverage these phenomena at any point or throughout segments of operating the electrified vehicle.

To determine the voltage at each of the electrical components, the controller 16 can receive signals from at least one voltage sensor of each of the plurality of electrical components. The controller 16 is in electrical communication with each of the electrical components through a private comm of the high-voltage bus system. Each of the plurality of electrical components can have a voltage sensor that detects the voltage at each of the electrical components. The voltage sensors can send information (e.g., wirelessly or through the cabling) to the controller indicating the voltage at each of the electrical components.

Calculation of the baseline voltage can depend on the number of electrical components that are connected to the high-voltage bus system 20. The baseline voltage can correspond to a subset of individual voltages. In some examples, the baseline voltage is a mean value of a subset of individual voltages. As further described below, the subset of voltages can exclude an individual voltage that is anomalous. In another example, the subset of individual voltages can include all the individual voltages for each of the electrical components in the plurality of electrical components except for the individual voltage that is anomalous. To calculate the baseline voltage, in some examples, the controller 16 determines a mean value of the individual voltages. The controller 16 can calculate the mean value of voltages by adding all voltages from the electrical components determined by the at least one voltage sensor of each of the electrical components and dividing by the number of the electrical components.

Optionally, the controller 16 of the powertrain 210 system is configured to control voltage conversions using the baseline voltage. The controller 16 can control the conversions that the DC/AC converter 260 and the DC/DC converter 270 perform using the baseline voltage. The controller 16 can use the baseline voltage to determine if the voltage is live on the high voltage bus or not. If the baseline voltage is detected to be live, the controller 16 enables the conversion function for the DC/AC converter 260 and the DC/DC converter 270.

Anomalous voltages as used herein are those that do not conform to acceptable parameters set relative to the baseline.

The controller 16 is also further configured to compare any one of the individual voltages of any one of the plurality of electrical components to the baseline voltage to determine if that individual voltage is anomalous. In some examples, the controller 16 is able to determine that one of the electrical components of the plurality of electrical components has an anomalous voltage when the voltage of the individual electrical component of the plurality of electrical components is lower than the baseline voltage. In another example, the controller 16 is able to determine that one of the electrical components of the plurality of electrical components has an anomalous voltage if the voltage of the individual electrical component of the plurality of electrical components is higher than the baseline voltage. In one example, the controller 16 can calculate an accumulated error by monitoring the difference between the individual voltage of an electrical component and the baseline voltage over a predetermined period of time. In a further example, the controller 16 determines that a voltage is anomalous if the accumulated error of the individual voltage of one electrical component in the plurality of electrical components is different from the baseline voltage for more than two seconds.

Some such parameters relative to the baseline can be time based. For instance, the mean value can be taken over a period of time (e.g., virtually instantaneously or over segments of milliseconds, seconds, minutes, hours, etc.). The evaluation period is the period of time over which the voltages of the individual components are compared to the baseline voltage. In some examples, the evaluation period can be one second. In other examples, the evaluation period can be multiple seconds, minutes, or hours. For example, the evaluation period may be any period of time between 0.2 seconds to 2 seconds. The evaluation period can be a predetermined evaluation period set taken from a reference point (e.g., from vehicle charge, start, or sometime thereafter), and conveying information by the controller 16 occurs during or after such evaluation periods. Evaluation periods can occur sporadically or recur at set intervals. Optionally, evaluation periods can be of equal length, varying length, or the like. These example evaluation periods are just some of many examples that are made apparent to those of skill in the art in view of this disclosure.

For troubleshooting purposes, the identify of an electrical component that is experiencing an anomalous voltage is useful for the operator of the system to know. In some examples, the controller 16 is further configured to identify each of the electrical components in the plurality of electrical components and convey information related to the identity of electrical components to an operator when the individual voltage of the electrical component is anomalous. The controller 16 can be configured to convey the identity of an electrical component in the plurality of electrical components that is experiencing a voltage anomaly.

Examples of such a conveyance is discussed in more detail in relation to methods described elsewhere herein. For instance, the controller 16 can be configured to alert the operator of a voltage anomaly and send a signal that a service engineer can use to identify if the anomaly is caused by faulty cabling or a faulty electrical component. The controller 16 uses signals from the voltage sensor of each electrical component to determine if a voltage anomaly is caused by the electrical component or connected cabling.

If one of the components has a voltage anomaly, either its voltage measurement has issue or its cable. For instance, the cable can have connection deterioration or disconnect from high voltage junction box. For example, after the controller 16 determines there is a voltage anomaly, the controller 16 checks the signal from the voltage sensor of the electrical component with the anomalous voltage. If the voltage sensor of the electrical component indicates that the electrical component has a voltage that is different from the baseline voltage (e.g., consistently higher or lower voltage than baseline but within a voltage range about the baseline), the controller 16 will notify a user (e.g., an operator or a service engineer) that the electrical component is causing the anomaly. However, if the controller 16 receives the signal from the voltage sensor of the electrical component experiencing a voltage anomaly that the electrical component is otherwise different from the baseline voltage (e.g., trending toward or at zero), the controller 16 can notify the service engineer that the cabling is causing the anomaly. In another example, the controller 16 is able to indicate to the operator the severity of the anomaly. These examples are just some of many examples disclosed herein as will be appreciated by one skilled in the art.

Figure 5:
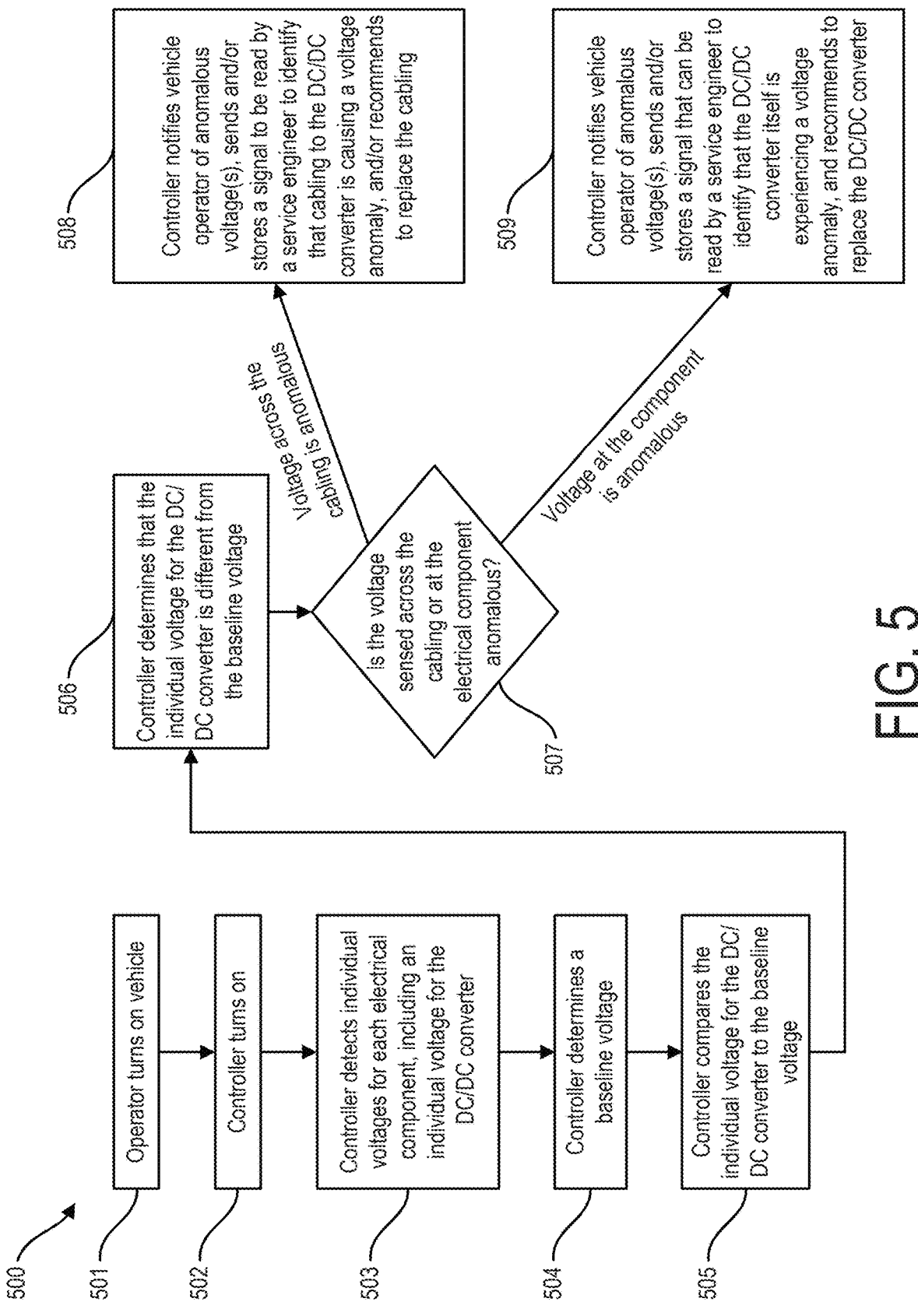
FIG. 5 is a flowchart of an example of the method of troubleshooting anomalies in a high-voltage bus system.

The system discussed herein is perhaps best understood in the context of a specific, practical non-limiting example of a vehicle operator experiencing an issue with an electrical component partway through the day. FIG. 5 depicts an example 500 of a vehicle experiencing a voltage anomaly. During operation when the vehicle is at rest, and not electrified, the controller is off. The operator turns on the vehicle, during step 501, to begin use. The battery supplies voltage to all the electric components connected on the high-voltage bus. The controller is on and begins to direct and control aspects of the vehicle's electrical components.

Continuing with this practical example, the controller identifies which components are connected on the high-voltage bus at step 502. At step 503, controller determines how much voltage is supplied to each of the components, and calculates a baseline voltage in step 504. At step 505, the controller compares the individual voltages determined using the individual voltage sensors of each of the electrical components to the baseline voltage. The entire time while the vehicle is turned on, the controller is monitoring the voltages of all the electrical components through the signals from the voltage sensors in each of the electrical components. In this example, potentially due to wear and tear caused by time, the controller detects a voltage anomaly in the DC/DC converter, as seen in step 506.

Remedial action in this practical example may include replacing an electrical component, connected cabling, or both. As seen in FIG. 5, the controller may read (e.g., as sensed by the voltage sensor or otherwise communicated to the controller) that the voltage across the cabling from the HV DC junction box to the DC/DC converter is less than the baseline voltage in step 507. The controller then completes step 508 by notifying the operator that there is a voltage anomaly. Using a diagnostic tool, a service engineer can read the notification of the anomaly and identify both that the DC/DC converter cabling has a voltage anomaly. The controller can then make the recommendation that the cabling be replaced, and exclude the anomalous electrical component from the baseline calculation for further monitoring of other anomalies. The diagnostic tool used by the service engineer can be similar to those already known in the art, such as tools used to read signals sent out by a vehicle controller. Such tools can include on-board diagnostics or similar type systems with corresponding diagnostic trouble codes. In another example seen in steps 507 and 509, if the controller determines that the voltage at the DC/DC converter is different from the baseline voltage, the controller notifies the operator that there is a voltage anomaly and the DC/DC converter electrical component is the cause of the anomaly. Using a diagnostic tool, a service engineer can read the notification of the anomaly and identify both that the DC/DC converter has a voltage anomaly and the recommendation that the converter be replaced.

The system discussed herein can perhaps be also understood in the context of an example with real numbers. For example, using method 400, the controller 16 detects the individual voltages for each of the electrical components through signals from the voltage sensors of each of the electrical components. The controller receives the signals from the voltage sensors via private comm cabling. The controller 16 determines the baseline voltage of the high-voltage bus system by adding up all the individual voltages from the voltage sensors of each of the plurality of components and dividing the total voltage by the number of electrical components connected to the high-voltage bus.

In this non-limiting example, the controller determines the mean baseline voltage is 730V. The controller 16 then compares each individual voltage read by the sensor on each of the electrical components to the baseline voltage of 730V. The controller 16 detects that the voltage sensor of the DC/DC converter is sensing 820V across the connected cabling. The controller 16 can determine that the DC/DC converter is experiencing a voltage anomaly and it is the electrical component that is causing the anomaly.

In another non-limiting example, the controller 16 can determine that the DC/DC converter is experiencing a voltage anomaly if the accumulated error of voltage read by the voltage sensor in the DC/DC converter is above a certain threshold for a predetermined period of time. For example, if controller 16 detects a voltage that is 100V or more above or below the baseline voltage then controller 16 may detect a voltage anomaly. Continuing with the example numbers listed above, if the voltage sensor of the DC/DC converter read at 820V for more than two seconds, the controller can determine that the DC/DC converter was experiencing a voltage anomaly. The controller 16 can notify the service engineer (e.g., locally or remotely) of the voltage anomaly and the cause of the anomaly so the service engineer can take remedial action. The controller 16 can exclude the anomalous 820V experienced by the DC/DC converter from the baseline voltage calculation and continue monitoring the high-voltage bus system.

In all the examples, the DC/DC converter can also indicate to the operator the severity of the anomaly. For example, if the voltage sensor of the DC/DC converter is receiving no voltage due to the cabling being faulty, the converter will indicate to the operator a high level of severity of the anomaly. Whereas if the DC/DC converter is still receiving a fraction of the voltage, the controller will indicate only a moderate level of severity of the anomaly.

Figure 4:
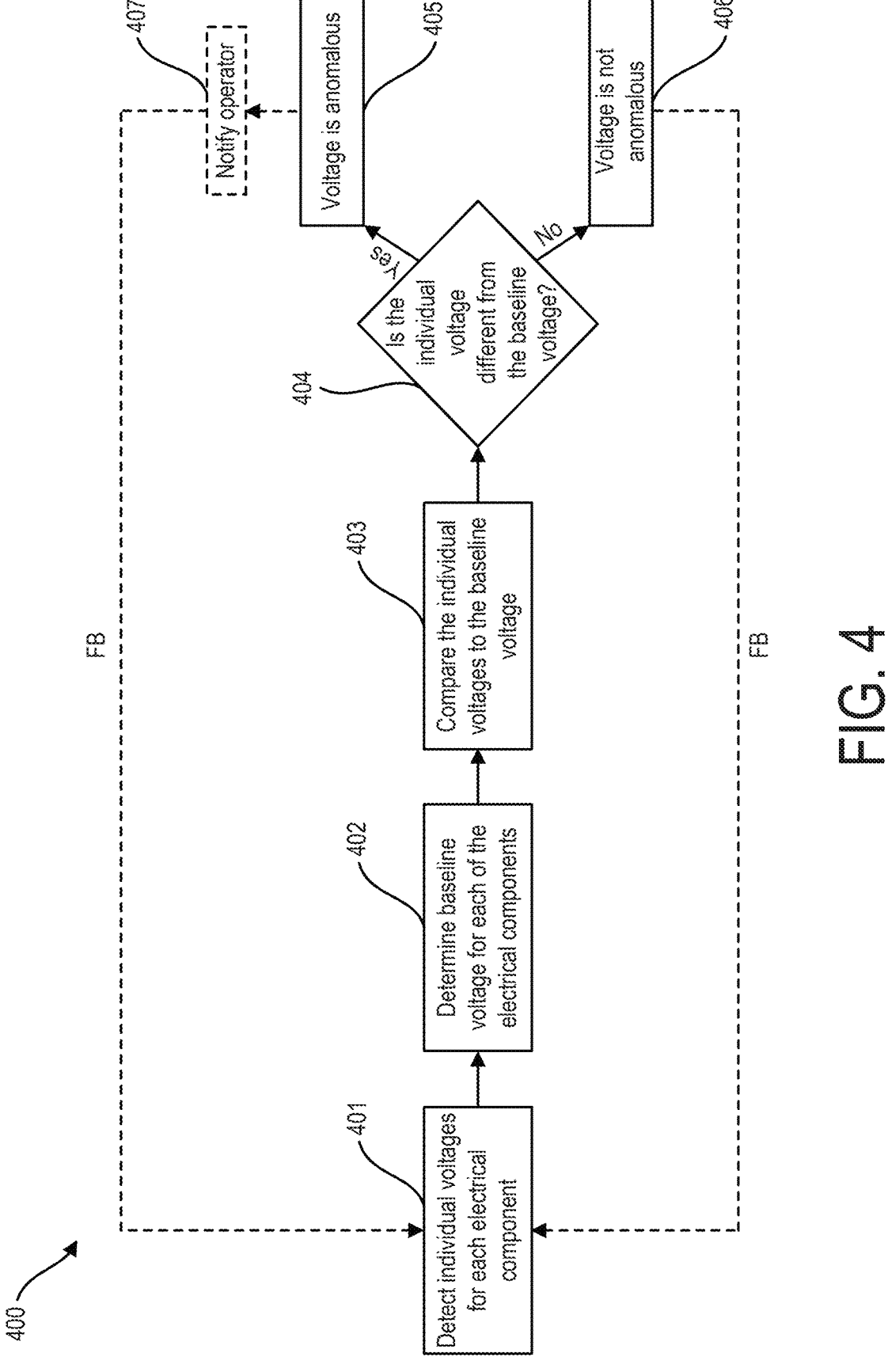
FIG. 4 is a flowchart of a method of troubleshooting anomalies in a high-voltage bus system for an electrified vehicle.

Methods of diagnosing and troubleshooting voltage anomalies in electrified vehicles are also disclosed herein. In this regard, not only will the operator be informed of when such an anomaly exists but remedial measures with which to troubleshoot and ultimately cure the anomaly can be provided to a service engineer. As will be understood by those skilled in the art, the method can be performed using any of the controllers discussed elsewhere herein. As an example of such a method, FIG. 4 depicts a method 400 of troubleshooting anomalies in a high-voltage bus system for an electrified vehicle. To begin, at step 401, the method 400 can include detecting individual voltages for each electrical component in the plurality of electrical components using voltage sensors of each of the plurality of electrical components. At step 402, a baseline voltage for each of the electrical components can be determined. As seen in FIG. 4, to find an anomaly in the high-voltage bus system, method 400 includes comparing any one of the individual voltages to the baseline voltage at step 403. A determination step 404 follows completion of step 403.

At step 404, a determination of whether the individual voltage differs enough from the baseline voltage to be anomalous is made. If it is determined that the individual voltage does not differ in this manner from the baseline voltage, it is concluded that the voltage is not anomalous at step 406. If, on the other hand, the individual voltage differs in this manner from the baseline voltage, it is concluded that the voltage is anomalous at step 405. For example, an individual voltage can be determined to be anomalous if at least one of the following conditions is true: the individual voltage is consistently higher than the baseline voltage over the evaluation period and the individual voltage is consistently lower than the baseline voltage over the evaluation period. It is contemplated that the baseline voltage may include a range (e.g., a range of voltages) to account for calculation errors or delays, for example. Method 400 can include calibrating the degree or range from which an individual voltage must differ from the baseline voltage to be considered anomalous. The degree or range can be specific to the sensitivity of the electrical components in the system. For example, the degree or range an individual voltage can differ from the baseline voltage may correspond to the accuracy of certain electrical components. Method 400 can include notifying the operator of the anomalous voltage at step 407. These notifications can be used for troubleshooting and remedial purposes. Both determinations at step 405 and step 406 can result in a feedback loop FB that begins method 400 again.

As noted above, baseline voltage is used at steps 402, 403, and 404. The baseline voltage can correspond to a subset of individual voltages. The subset of voltages can exclude an individual voltage that is anomalous. In some examples, the subset of individual voltages can include all the individual voltages for each of the electrical components in the plurality of electrical components except for the individual voltage that is anomalous. In another example, the baseline voltage is a mean value of the subset of individual voltages. The mean value can be calculated by dividing the total sum of the individual voltages for each electrical component by the total number of electrical components of the system.

In another example, the baseline voltage can be determined over an evaluation period. The evaluation period is the period of time over which the voltages of the individual components are compared to the baseline voltage. In some examples, the evaluation period can be one second. In other examples, the evaluation period can be multiple seconds, minutes, or hours. The evaluation period can be a predetermined evaluation period set taken from a reference point (e.g., from vehicle charge, start, or sometime thereafter), and conveying information by the controller occurs during or after such evaluation periods. Evaluation periods can occur sporadically or recur at set intervals. Optionally, evaluation periods can be of equal length, varying length, or the like. These example evaluation periods are just some of many examples that are made apparent to those of skill in the art in view of this disclosure.

When an anomalous voltage is determined, the method 400 can facilitate remedial cation to be taken. In some examples, steps 403 and 404 in FIG. 4, which include comparing any one of the individual voltages to the baseline voltage and determining if that individual voltage is anomalous, is used to perform a voltage sensor rationality check on the electrical component that has the individual voltage that is anomalous. If any electrical component is determined to have an anomalous voltage, the cause of the anomaly can be determined. The cabling corresponding to the electrical component with the anomalous voltage could be faulty. In that case, the cabling would need to be replaced or repaired. Alternatively, the actual electrical component can be faulty and cause the anomaly. In the latter case, the electrical component may need to be replaced or repaired. When a voltage is determined to be anomalous by comparing the individual voltages sensed by the voltage sensor of each electrical component of the plurality of electrical components, to the baseline voltage, the voltage sensor rationality check determines if the anomaly is caused by the cabling or the electrical component by determining if the voltage at an individual electrical component is different from the baseline voltage. If the sensed voltage of the electrical component experiencing a voltage anomaly indicates that the cabling is causing the anomaly (e.g., is trending toward zero, is outside of a range about the baseline, etc.), the method 400 includes determining that the cabling is causing the voltage anomaly. If the sensed voltage of the electrical component experiencing a voltage anomaly indicates that the electrical component is causing the anomaly (e.g., is trending or consistently above, below, or within a range on either side of the baseline, etc.), the method 400 includes determining that the electrical component is causing the voltage anomaly. In some examples, the method 400 includes replacing the cabling when it is determined that the connected cabling caused the individual voltage to be anomalous. The method 400 further includes replacing the electrical component if it is determined that the connected cabling did not cause the individual voltage to be anomalous.

Another example of method 400 in FIG. 4 includes step 407 of alerting an operator of the electrified vehicle when it is determined that the individual voltage is anomalous. For example, the system includes an alert system to alert the operator of the electrified vehicle that an anomalous voltage has been detected. In another example, the system includes an alert system that indicates a degree to which the individual voltage is anomalous. For example, the system can include a series of colored lights (e.g., red, yellow, and green as conventionally used) that correspond with the degree of which the individual voltage is anomalous. In yet another example, when an anomaly is detected, the method 400 includes sending a service engineer a code that corresponds with a course of remedial action. The service engineer has access to a troubleshooting tree that lists all anomaly codes that correspond with a corrective course of action. The courses of action can be to replace a particular high-voltage cable or to replace a particular one of the electric components of the plurality of electrical components.

Figure 6:
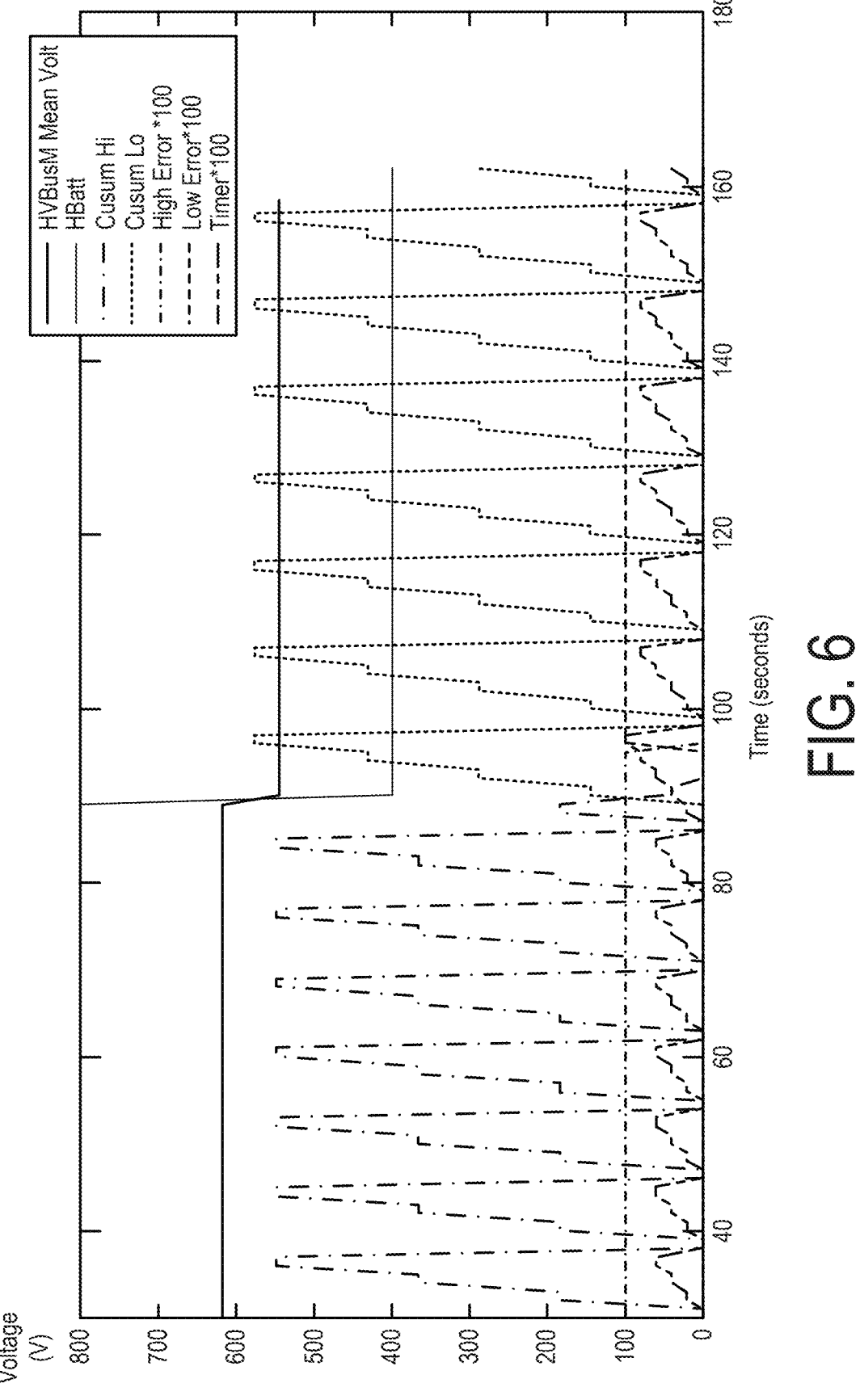
FIG. 6 is a plot of the voltage output a battery controlled by a controller implementing the method of FIG. 4.
Figure 7:
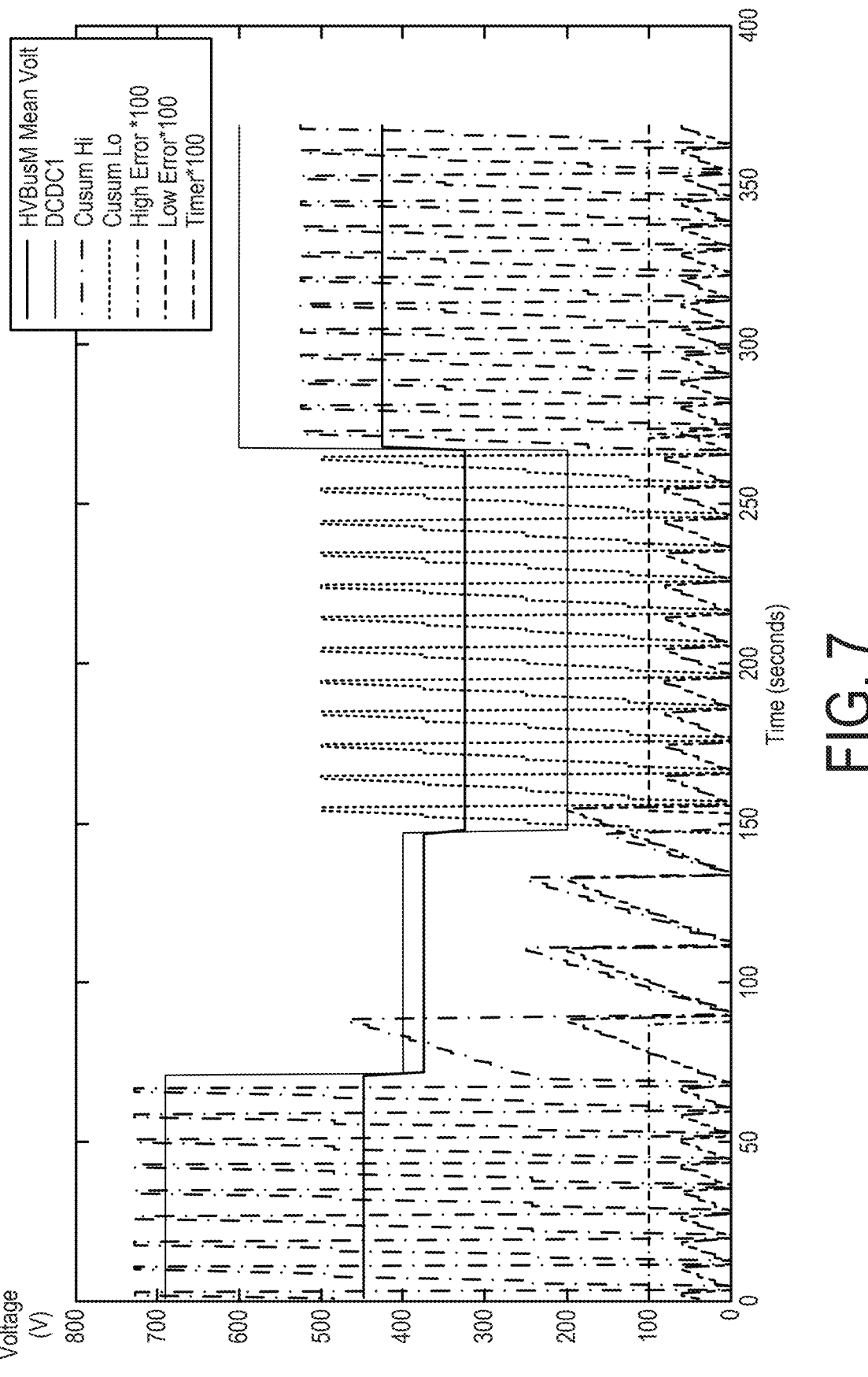
FIG. 7 is a plot of the voltage output of a DC/DC converter controlled by a controller implementing the method of FIG. 4.

In another example, the method 400 of trouble shooting anomalous voltages is continuously run while the high-voltage battery is supplying voltage to the high-voltage bus. In one example, a voltage is determined to be anomalous if the voltage of one electrical component in the plurality of electrical components is different from the baseline voltage for more than two seconds. The method 400 can also include a calculation of accumulated error. Accumulated error can be determined by adding the difference between the individual voltage and the baseline voltage over a predetermined period of time. In one example, a voltage is determined to be anomalous if the accumulated error reaches a set threshold. In another example, the voltage is determine to be anomalous if the accumulated error of an individual voltage of one electrical component in the plurality of electrical components is different from the baseline voltage for more than two seconds. For example, as seen in FIGS. 6 and 7, data is shown when method 400 is implemented. Several trends in the data may be observed to calibrate method 400. The voltage thresholds are shown to 500 and 600 volts with a maximum of 100000 volts and a tolerance of 100 volts. In another example, the thresholds are 900 volts with a max 100000 and tolerance of 0 volt.

It is well understood that methods that include one or more steps, the order listed is not a limitation of the claim unless there are explicit or implicit statements to the contrary in the specification or claim itself. It is also well settled that the illustrated methods are just some examples of many examples disclosed, and certain steps may be added or omitted without departing from the scope of this disclosure. Such steps may include incorporating devices, systems, or methods or components thereof as well as what is well understood, routine, and conventional in the art.

The connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an example, B alone may be present in an example, C alone may be present in an example, or that any combination of the elements A, B or C may be present in a single example; for example, A and B, A and C, B and C, or A and B and C.

In the detailed description herein, references to "one example," "an example," "an example," etc., indicate that the example described may include a particular feature, structure, or characteristic, but every example may not necessarily include the particular feature, structure, or characteristic. Moreover, such phrases are not necessarily referring to the same example. Further, when a particular feature, structure, or characteristic is described in connection with an example, it is submitted that it is within the knowledge of one skilled in the art with the benefit of the present disclosure to affect such feature, structure, or characteristic in connection with other examples whether or not explicitly described. After reading the description, it will be apparent to one skilled in the relevant art(s) how to implement the disclosure in alternative examples.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus While the present disclosure has been described as having an exemplary design, the present disclosure may be further modified within the spirit and scope of this disclosure. This application is therefore intended to cover any variations, uses, or adaptations of the disclosure using its general principles. Further, this application is intended to cover such departures from the present disclosure as come within known or customary practices in the art to which this disclosure pertains.

What is claimed is:

1. A method of troubleshooting anomalies in a high-voltage bus system for an electrified vehicle, the high-voltage bus system being electrically connected to a plurality of electrical components such that each electrical component in the plurality of electrical components has the same voltage when the high-voltage bus system is electrified, the method being implemented by a controller of the electrified vehicle and comprising:

receiving an indication of one or more individual voltages for each of the electrical components in the plurality of electrical components using a voltage sensor of each of the electrical components in the plurality of electrical components, the voltage sensor being in communication with the controller;

receiving an indication of a baseline voltage for each of the electrical components in the plurality of electrical components, the baseline voltage corresponding to at least a subset of the individual voltages for each of the electrical components in the plurality of electrical components;

wherein the baseline voltage is determined over an evaluation period of 0.5 second to 2 seconds;

receiving an indication of a comparison of any one of the individual voltages to the baseline voltage; and identifying whether any one of the electrical components in the plurality of electrical component requires troubleshooting based on whether the individual voltage is anomalous relative to the baseline voltage.

2. The method of claim 1, wherein the baseline voltage is a mean value of the subset of the individual voltages.

3. The method of claim 2, wherein the mean value is equal to a total sum of the individual voltages for each of the electrical components included in the subset of the plurality of electrical components divided by a total number of the electrical components on the high-voltage bus system.

4. The method of claim 2, wherein when one of the individual voltages is anomalous, the subset of the individual voltages is revised to exclude that individual voltage that is anomalous.

5. The method of claim 4, wherein the subset of the individual voltages includes all the individual voltages for each of the electrical components in the plurality of electrical components except for the individual voltage that is anomalous.

6. The method of claim 1, wherein the individual voltage is anomalous if at least one of the following conditions is true:

the individual voltage is consistently higher than the baseline voltage by 100 volts over the evaluation period, and the individual voltage is consistently lower than the baseline voltage by 100 volts over the evaluation period.

7. The method of claim 1, wherein the comparing any one of the individual voltages to the baseline voltage constitutes performing a voltage sensor rationality check on the electrical component that has the individual voltage that is anomalous.

8. The method of claim 1, further comprising:

receiving an indication that the individual voltage that is anomalous resides at one or more of the connected cabling and corresponding connections between the high-voltage bus system and the electrical component; and recommending a first remedial measure that includes at least one of:

replacing the connected cabling and replacing the electrical component.

9. The method of claim 8, wherein the first remedial measure is replacing the connected cabling, the method further comprising receiving, after the first remedial measure, an indication that the individual voltage that is anomalous resides at one or more of the connected cabling and corresponding connections between the high-voltage bus system and the electrical component; and recommending as a second remedial measure subsequent to the first remedial measure replacing the electrical component.

10. The method of claim 1, further comprising providing an alert to an operator of the electrified vehicle if the individual voltage is anomalous.

11. The method of claim 10, wherein the alert indicates a degree to which the individual voltage is anomalous.

12. A controller for managing anomalies in a high-voltage bus system for an electrified vehicle, the high-voltage bus system being electrically connected to a plurality of electrical components such that each electrical component in the plurality of electrical components has the same voltage when the high-voltage bus system is electrified, the controller being configured to:

detect individual voltages for each electrical component in the plurality of electrical components using a voltage sensor of each of the electrical components in the plurality of electrical components; and detect whether any one of the individual voltages is anomalous relative to a baseline voltage for each of the electrical components in the plurality of electrical components, the baseline voltage corresponding to at least a subset of the individual voltages;

wherein the baseline voltage is determined over an evaluation period of 0.5 second to 2 seconds.

13. The controller of claim 12, wherein the controller is further configured to identify each of the electrical components in the plurality of electrical components and to convey information related to the identity of electrical components to an operator when it is determined that the individual voltage of the electrical component is anomalous.

14. The controller of claim 12, wherein the controller is formed as a system control module for the electrified vehicle.

15. The controller of claim 12, wherein the controller is further configured to influence a plurality of electrical components that perform voltage conversions using the baseline voltage.

16. A powertrain for an electrified vehicle, the powertrain comprising:

a high-voltage bus system;

a plurality of electrical components that are connected to the high-voltage bus system such that each electrical component in the plurality of electrical components has the same voltage when the high-voltage bus system is electrified; and a controller for managing anomalies in the high-voltage bus system, the controller being configured to:

detect individual voltages for each of the electrical components in the plurality of electrical components using a voltage sensor of each of the electrical components in the plurality of electrical components; and detect whether any one of the individual voltages is anomalous relative to a baseline voltage for each of the electrical components in the plurality of electrical components, the baseline voltage corresponding to at least a subset of the individual voltages;

wherein the baseline voltage is determined over an evaluation period of 0.5 second to 2 seconds.

17. The powertrain of claim 16, wherein the powertrain is configured to be integrated into a battery-operated vehicle.

18. The powertrain of claim 16, wherein the powertrain is configured to be integrated into a hybrid vehicle.

19. The powertrain of claim 16, wherein the controller is further configured to identify each of the electrical components in the plurality of electrical components and to convey information related to the identity of the electrical components to an operator when it is determined that the individual voltage of the electrical component is anomalous, wherein the baseline voltage is a mean value that is equal to a total sum of the individual voltages for each of the electrical components included in the subset of the plurality of electrical components divided by a total number of the electrical components on the high-voltage bus, and wherein the individual voltage is determined to be anomalous if at least one of the following conditions is true:

the individual voltage is consistently higher than the baseline voltage by 100 volts over an evaluation period of 0.5 second to 2 seconds, and the individual voltage is consistently lower than the baseline voltage by 100 volts over an evaluation period of 0.5 second to 2 seconds.

* * * * *